United States Patent [19]
Lee

[11] Patent Number: 5,748,526
[45] Date of Patent: May 5, 1998

[54] CIRCUIT FOR REPAIR OF FLASH MEMORY CELLS AND A METHOD OF REPAIR

[75] Inventor: Jong Oh Lee, Ichon, Rep. of Korea

[73] Assignee: Hyundai Electronics Industries Co., Ltd., Kyungki-Do, Rep. of Korea

[21] Appl. No.: 698,514

[22] Filed: Aug. 15, 1996

[30] Foreign Application Priority Data

Aug. 17, 1995 [KR] Rep. of Korea .................. 95-25228

[51] Int. Cl.$^6$ .................................................. G11C 16/04
[52] U.S. Cl. ............................ 365/185.09; 365/189.07; 365/225.7
[58] Field of Search ..................... 365/185.09, 200, 365/225.7, 230.06, 189.07; 371/10.1, 10.2, 10.3

[56] References Cited

U.S. PATENT DOCUMENTS

| | | | |
|---|---|---|---|
| 5,200,922 | 4/1993 | Rao | 365/200 |
| 5,325,334 | 6/1994 | Roh | 365/201 |
| 5,329,488 | 7/1994 | Hashimoto | 365/200 |
| 5,471,431 | 11/1995 | McClure | 365/225.7 |
| 5,596,535 | 1/1997 | Mushya | 365/200 |

*Primary Examiner*—David C. Nelms
*Assistant Examiner*—Son Mai
*Attorney, Agent, or Firm*—Fish & Richardson P.C.

[57] ABSTRACT

The present invention relates to a circuit for repair of flash memory cell and a method of repair and, more particularly, to a circuit for repair of flash memory cell and a method of repair which facilitates the effective repair by supplying external addresses outputted from column address buffer to the column decoder in normal condition and supplying internal addresses generated in the inside at the time of repair by utilizing an address control circuit.

6 Claims, 3 Drawing Sheets

CIRCUIT FOR REPAIR OF FLASH MEMORY CELLS AND A METHOD OF REPAIR

BACKGROUND OF INVENTION

1. Field of the Invention

The present invention relates to a circuit for repair of flash memory cells and a method of repair and, more particularly, to a circuit for repair of flash memory cells and a method of repair which utilize an address control circuit which supplies external addresses to a column decoder in a normal condition and supplies internal addresses to the column decoder at the time of repair to perform a column repair.

2. Information Disclosure Statement

In general, repair means having in advance spare cells in addition to main cells and replacing the main cells with the spare cells if a poor quality occurs to the main cells.

However, the prior art repair technique involves complicated circuit due to a redundancy circuit and a redundancy decoder circuit for the redundancy at the time of confirmation of program and erasing of the flash memory cell. In addition, although the column repair can improve repair efficiency than the now repair, the repair operation for performing the column repair is very complicated. The reason is that the condition around a cell selected at the time of read and write of data stored in the cell is very complicated in comparison to other cells. As described above, the column repair has involved very complicated circuit due to various technical problems.

SUMMARY OF THE INVENTION

Therefore, the object of the present invention is to provide a circuit for repair of flash memory cells and a method of repair which can solve the above described disadvantages by supplying external addresses outputted from a column address buffer to a column decoder in a normal condition and supplying internal addresses generated in the inside of a fuse block to the column decoder at the time of repair by utilizing an address control circuit.

The present invention to achieve the above described object is characterized in that it comprises a column address buffer taking external addresses from an address pin as inputs; an address control circuit taking the external addresses via the column address buffer and internal addresses and address control signals generated from a fuse block group as inputs; a column decoder for selecting a proper bit line at the time of each operation mode taking the output of the address control circuit as input; a row decoder taking as input external addresses through a row address buffer from the address pin; and a group of flash memory cells connected between the column decoder and the row decoder.

In addition, the present invention is characterized in that it supplies external addresses outputted from the column address buffer to the column decoder in the normal condition and supplies internal addresses generated in the inside of the fuse block to the column decoder at the time of repair by utilizing the address control circuit to the repair circuit.

BRIEF DESCRIPTION OF THE DRAWINGS

For a fuller understanding of the nature and the objective of the invention, reference should be made to the following detailed description in conjunction with the accompanying drawings in which.

Similar references characters refer to similar parts through the several view of the drawings.

DETAILED DESCRIPTION OF THE DRAWINGS

The present invention will be described in detail below with reference to the accompanying drawing.

Figure 1:
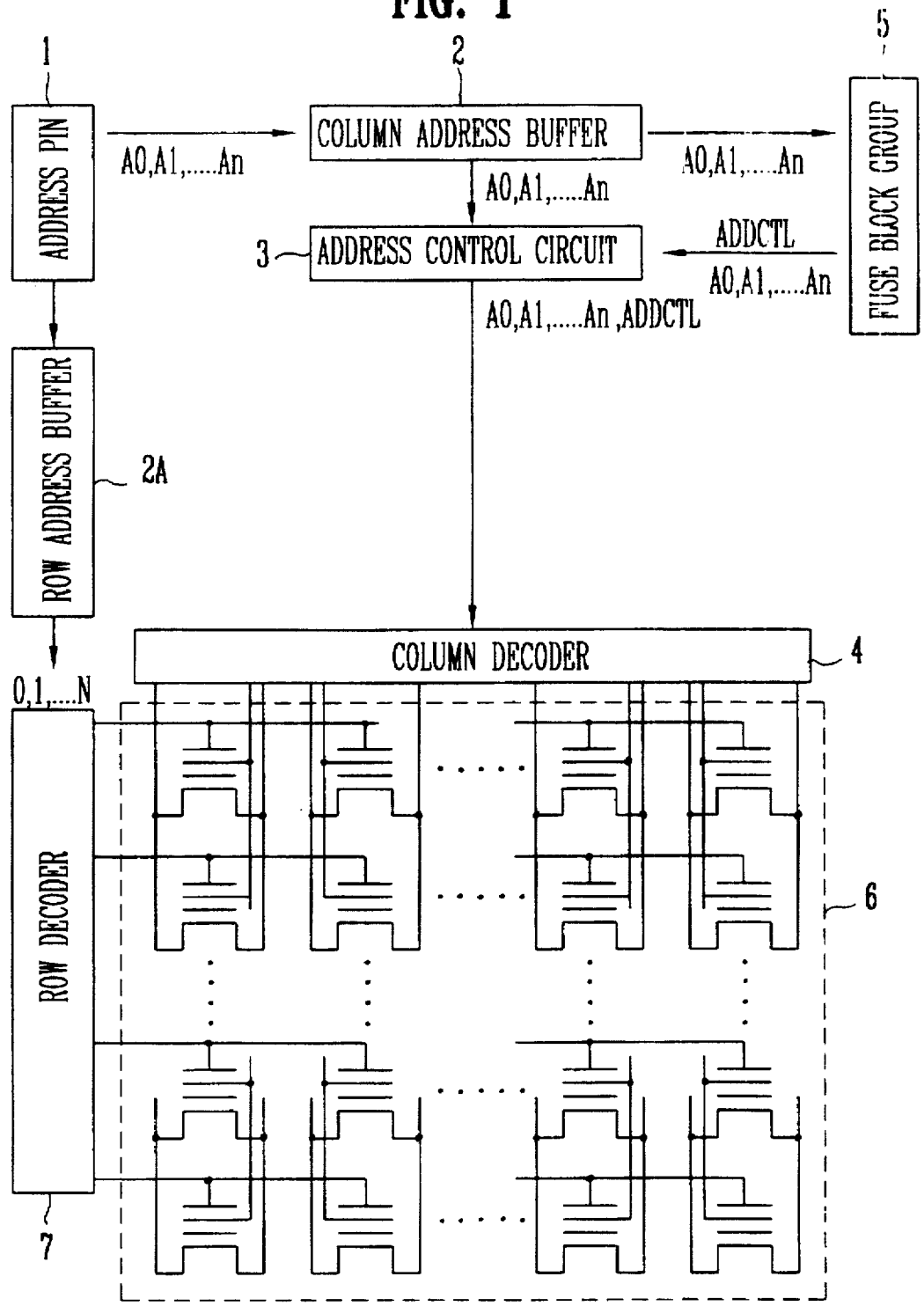
FIG. 1 is a circuit diagram for repair of a flash memory cell of the present invention.

FIG. 1 is a circuit diagram for repair of a flash memory cell of the present invention. The circuit for repair of a flash memory cell comprises a column address buffer 2 taking external addresses Ao through An from an address pin 1 as inputs; a fuse block group 5 receiving external addresses As through An from the column address buffer 2; an address control circuit 3 taking the external addresses Ao through An via the column address buffer 2 and internal addresses Ao through An and address control signals ADDCTL generated from the fuse block group 5 as inputs; a column decoder 4 for selecting a proper bit line at the time of each operation mode, that is, program, erasing and read out mode, taking the output of the address control circuit 3 as input; a row decoder 7 taking as input external addresses O through N outputted from the address pin 1 through a row address buffer 2A; and a group of flash memory cells 6 connected between the column decoder 4 and the row decoder 7. The operation of the circuit for repair of flash memory cells is described below.

Two kinds of addresses (external and internal addresses) and an address control signal ADDCTL are inputted to the address control circuit 3. That is, external address Ao through An outputted from the address pin 1, internal address Ao through An and the address control signal ADDCTL generated from the fuse block group 5 are inputted to the address control circuit 3. The external address Ao through An inputted from the address pin 1 is supplied to the column decoder 4 through the column address buffer 2 and the address control circuit 3. The fuse block group 5 selectively generates address according to the position of the repair column. In addition, if a poor quality cell is detected at the time of operation of read out and erase verification of cells, the fuse block group 5 generates the address control signal ADDCTL. When the address control signal ADDCTL is generated, the internal address Ao through An generated from the fuse bock group 5 is supplied to the column decoder 4 through the address control circuit 3. The column decoder 4 also acts a role of address for enabling a column where a repair cell exists at the time of repair and disabling external columns. For example, when a cell normally operates at the time of operation of read out and erase verification of cells, the address control signal ADDCTL is not generated. Therefore, the external address Ao through An inputted from the address pin 1 is supplied to the column decoder 4 through the column address buffer 2 and address control circuit 3. To the contrary, when a poor quality cell is detected at the time of operation of read out and erase verification, the address control signal ADDCTL is generated in the fuse block group 5. At this time, the internal address Ao through An generated from the fuse block group 5 is supplied to the column decoder 4 through the address control circuit 3 so that the repair operation is proceeded. That is, in normal condition, the external address Ao through An inputted from the address pin 1 is supplied to the column decoder 4, and at the time of repair, the internal address Ao through An generated at the fuse block group 5 is supplied to the column decoder 4.

Figure 2:
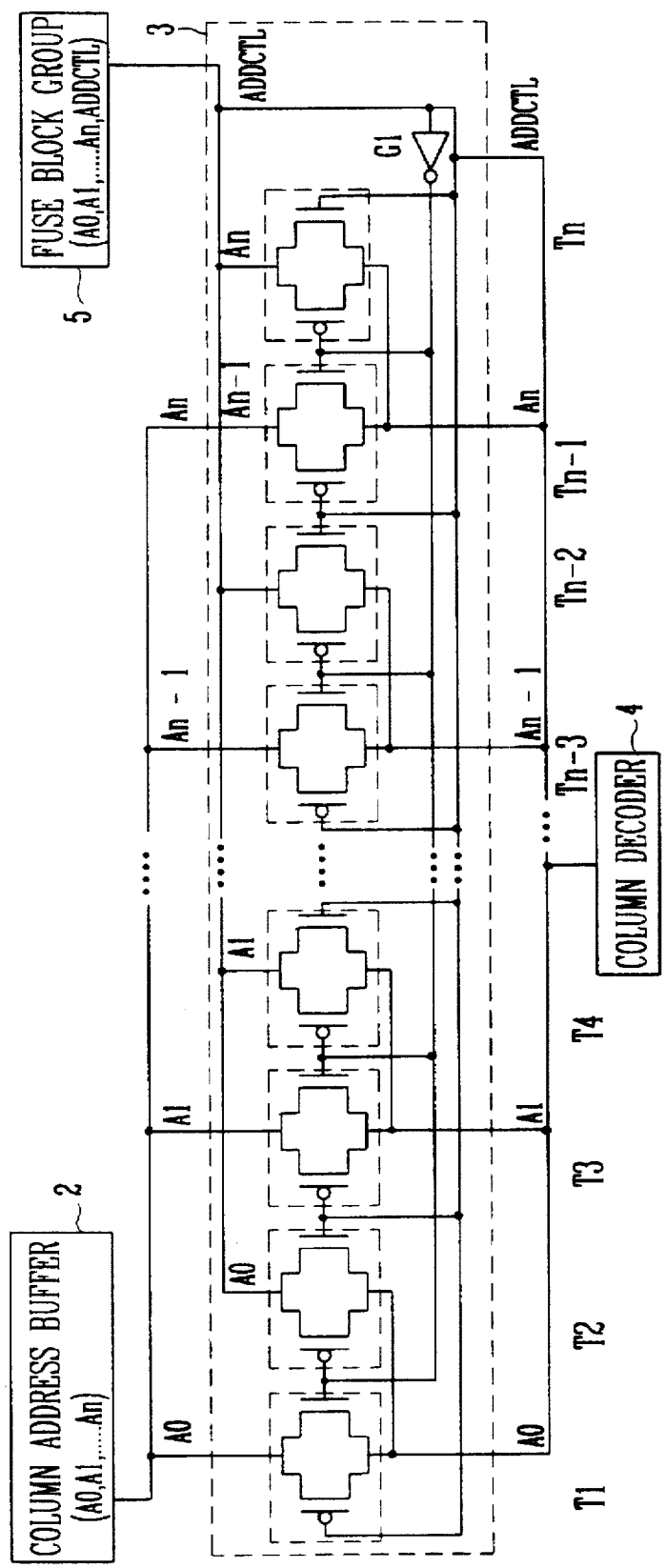
FIG. 2 is a detailed circuit diagram of an address control circuit of FIG. 1.

FIG. 2 is a detailed circuit diagram of the address control circuit of FIG. 1. The address control circuit is connected among the column address buffer 2, fuse block group 5 and column decoder 4, and consists of a plurality of transfer gates T1 through Tn each taking as input the address control signal ADDCTL and the address control signal ADDCTL via an inverter G1. The operation of the address control circuit 3 is described below.

In normal condition, the address control signal ADDCTL goes to Low condition. Therefore, odd number of transfer gates T1, T3 through Tn-1 among the plurality of transfer gates T1 through Tn are turned on so that the external address Ao through An outputted from the column address buffer 2 is supplied to the column decoder 4. At the time of repair, the address control signal ADDCTL goes to High condition. Therefore, even number of transfer gates T2, T4 through Tn among the plurality of transfer gates T1 through Tn are turned on so that the internal address Ao through An generated from the fuse block 5 is supplied to the column decoder 4.

Figure 3:
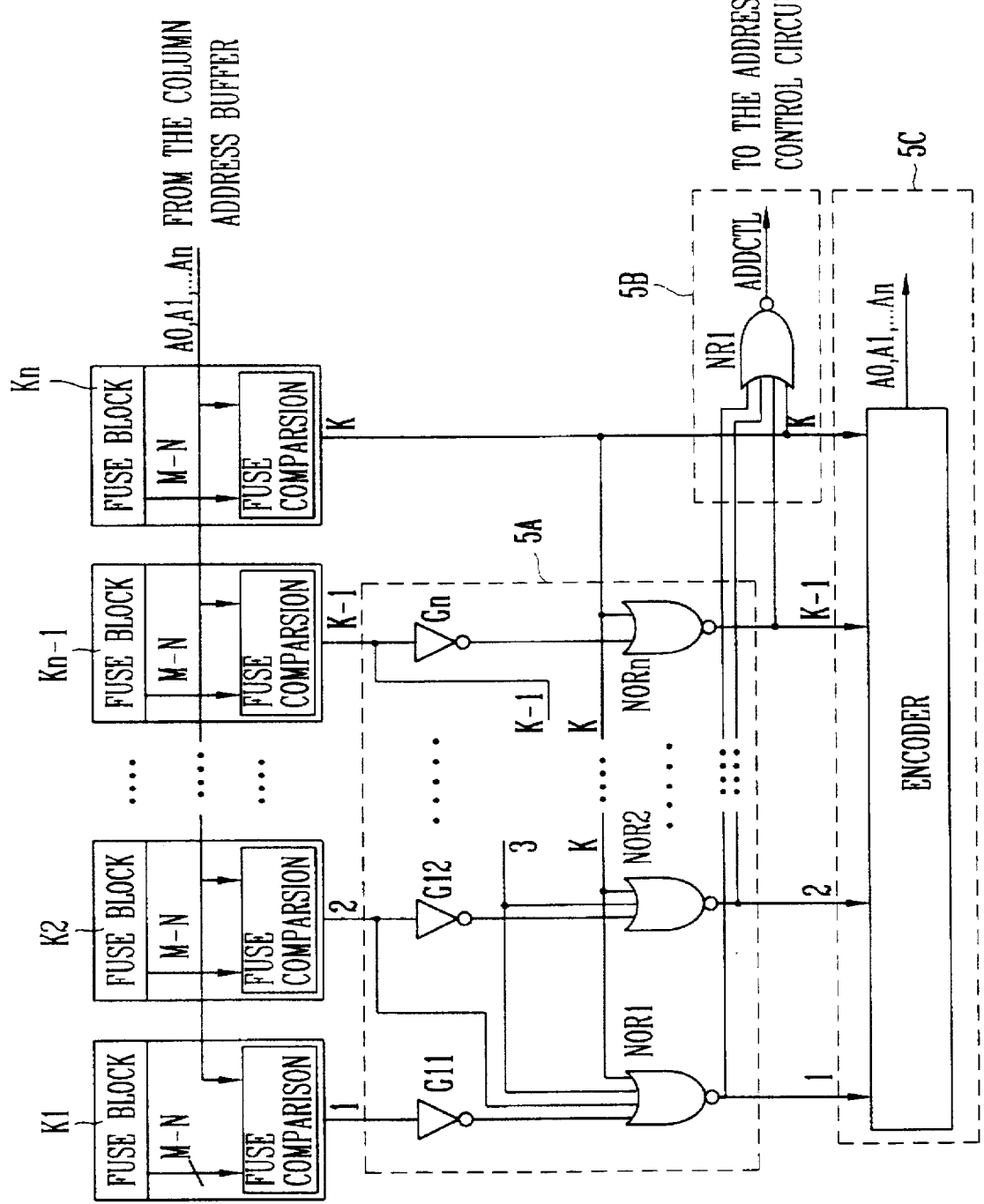
FIG. 3 is a detailed circuit diagram of a fuse block group of FIG. 1.

FIG. 3 is a detailed circuit diagram of the fuse block group 5. The fuse block consists of fuse blocks K1 through Kn for storing the repair address M-N, a first control circuit 5A for transferring the finally inputted column address to an encoder when same kind of addresses exist among the memorized addresses for repair, a second control circuit 5B for generating an address control signal ADDCTL consisting of a NOR gate NR1 taking signals generated at the first control circuit 5A, and a third control circuit 5C for generating the internal addresses Ao through An consisting of the encoder. Also, the fuse block group 5 has a plurality of a fuse blocks K1 through Kn. The fuse blocks K1 through Kn each include a fuse comparison. The fuse comparisons compare the external addresses Ao through An from the column address buffer 2 with the repair addresses M-N stored in the fuse blocks K1 through Kn and outputs addresses 1 through K which are the same as the repair address M-N to the first control circuit 5A. Operation of the fuse block is described below.

The first control circuit 5A generates internal addresses suitable for enabling the repair columns by a combination of a plurality of inverters G11 through Gn and a plurality of NOR gates NOR1 through NORn between each fuse block and the encoder. When same kind of addresses exist among the memorized addresses for repair (that is, when a repaired column is replaced with other column for repair due to the poor quality of the repaired column.), the first control circuit 5A supplies the finally inputted column address to an encoder. The second control circuit 5B generates the address control signal ADDCTL according to the signals generated at the first control circuit 5A. The third control circuit 5C generates the internal addresses Ao through An through the encoder according to the signals generated at the first control circuit 5A.

As described above, according to the present invention, there are excellent effects in that the column repair operation can be effectively proceeded and the column repair efficiency can be improved by supplying external addresses outputted from the column address buffer to the column decoder in the normal condition and supplying internal addressed generated in the inside of a fuse block to the column decoder at the time of repair by utilizing the address control circuit.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A circuit for repair of flash memory cell comprising:

a column address buffer to which external addresses are input from an address pin;

an address control circuit to which external addresses via said column address buffer, internal addresses and address control signals generated from a fuse block group are inputted;

a column decoder for selecting a proper bit line at the time of each operation mode, said column decoder receiving an output of said address control circuit;

a row address buffer to which said external addresses outputted from said address pin is inputted;

a row decoder to which said external addresses through said row address buffer in inputted; and a group of flash memory cells connected between said column decoder and row decoder.

2. The circuit of claim 1, wherein said address control circuit outputs said external address of said column address buffer at the time of normal condition and outputs said internal address generated from said fuse block at the time of repair according to said address control signal.

3. The circuit of claim 1, wherein said address control circuit is connected between said column address buffer, fuse block group and said column decoder, and includes a plurality of transfer gates to which said address control signal and said address control signal via an inverter are inputted.

4. A method of repair of flash memory cell comprising the steps of:

supplying internal addresses generated at a fuse block and external addresses via a column address buffer to an address control circuit; and disabling a normal column, where a poor quality cell exists, by means of a column decoder according to said internal or external address signals of said address control circuit, and enabling a repair column where a repair cell exists.

5. The method of claim 4, wherein said address control circuit selectively supplies said internal and external addresses to said column decoder according to the operation of a plurality of transfer gates each taking as input said address control signal and said address control signal via an inverter.

6. A circuit for repair of a flash memory cell comprising:

a column address buffer to which external addresses are inputted from an address pin;

a fuse block group to which said external addresses are inputted via said column address buffer, said fuse block group comprising a plurality of fuse blocks;

a fuse comparison device comparing said external address with repair addresses stored therein;

an address control circuit to which external addresses via said column address buffer, internal addresses and address control signals generated from said fuse block group are inputted;

a column decoder for selecting a proper bit line at the time of each operation mode, said column decoder receiving an output of said address control circuit;

a row address buffer to which said external addresses outputted from said address pin is inputted;

a row decoder to which said external addresses through said row address buffer is inputted; and a group of flash memory cells connected between said column decoder and row decoder.

* * * * *